United States Patent [19]  [11] 4,103,075
Adam  [45] Jul. 25, 1978

[54] COMPOSITE MONOLITHIC LOW-LOSS SUPERCONDUCTOR FOR POWER TRANSMISSION LINE

[75] Inventor: Erik Adam, Murray Hill, N.J.

[73] Assignee: Airco, Inc., Montvale, N.J.

[21] Appl. No.: 736,611

[22] Filed: Oct. 28, 1976

[51] Int. Cl.$^2$ .................... H01B 5/00; H01B 7/34
[52] U.S. Cl. ........................... 428/614; 174/15 S; 428/651; 428/660; 428/661; 428/662; 428/663; 428/672; 428/673; 428/685; 428/930
[58] Field of Search ............ 174/15 S, 126 S, 128 S; 428/610, 611, 614, 651, 660, 661, 662, 663, 664, 665, 668, 930, 941, 672, 673, 674, 685; 29/624

[56] References Cited
U.S. PATENT DOCUMENTS

| 3,449,092 | 6/1969 | Hammond | 428/930 |
|---|---|---|---|
| 3,458,293 | 7/1969 | Schindler | 428/614 |
| 3,523,361 | 8/1970 | Kinter et al. | 174/126 S |
| 3,612,742 | 10/1971 | Snowden | 174/126 S |
| 3,731,374 | 5/1973 | Suenager et al. | 428/662 |
| 3,754,095 | 8/1973 | Aupoix et al. | 174/126 CR |
| 3,910,802 | 10/1975 | Wong | 428/662 |

Primary Examiner—L. Dewayne Rutledge
Assistant Examiner—Michael L. Lewis
Attorney, Agent, or Firm—E. W. Bopp; M. de Angeli

[57] ABSTRACT

A composite superconductor having both filamentary and film conductors for carrying the pure and impure components of direct current, respectively, or for alternating current, is disclosed, together with a method of making it, and a preferred arrangement for its use in high power transmission lines.

14 Claims, 7 Drawing Figures

Nb. FILS. IN Bz.

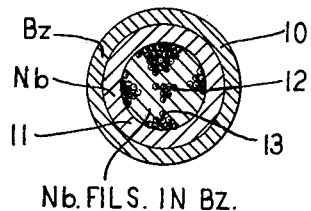
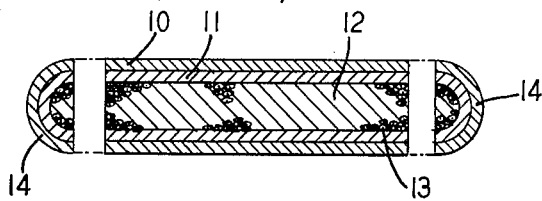
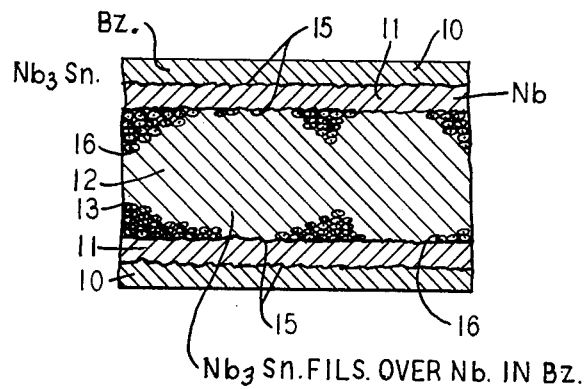
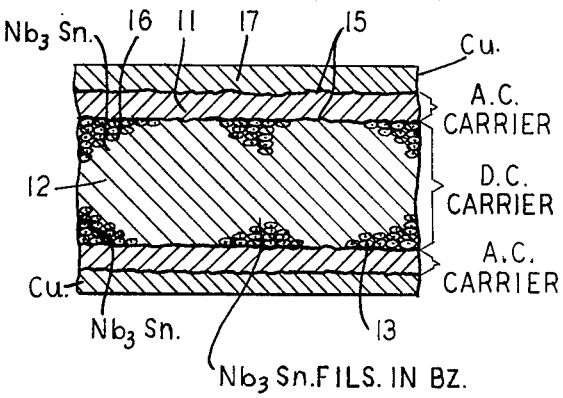
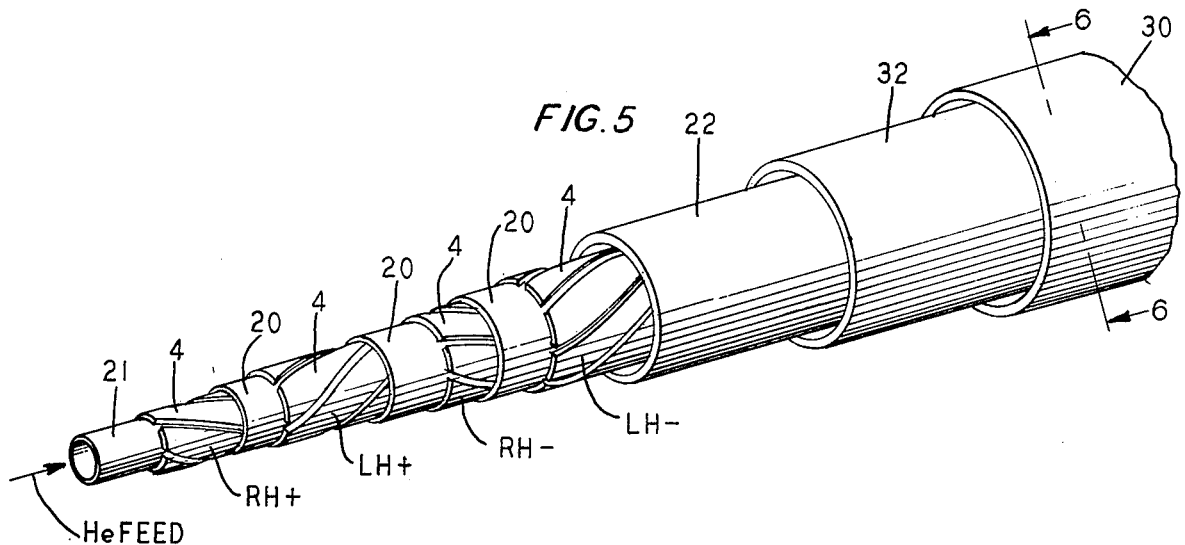

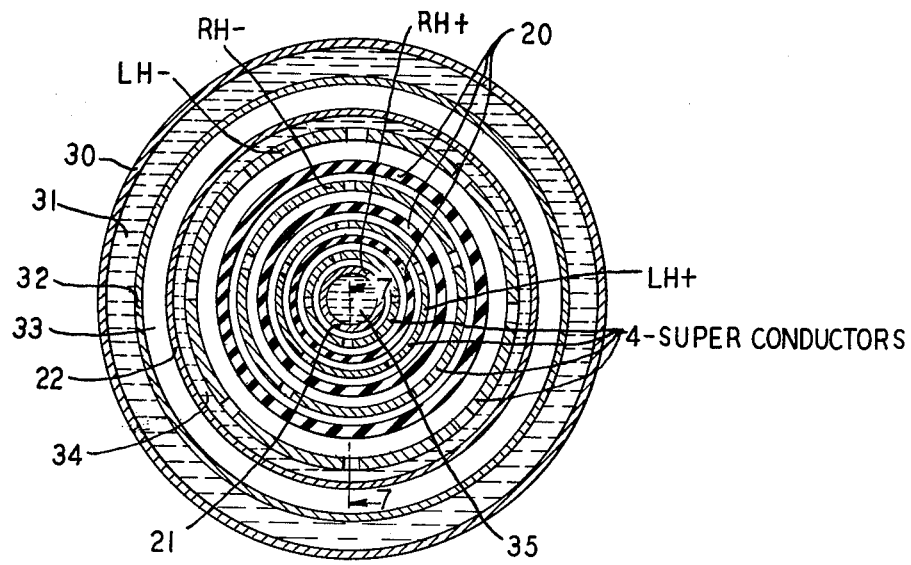
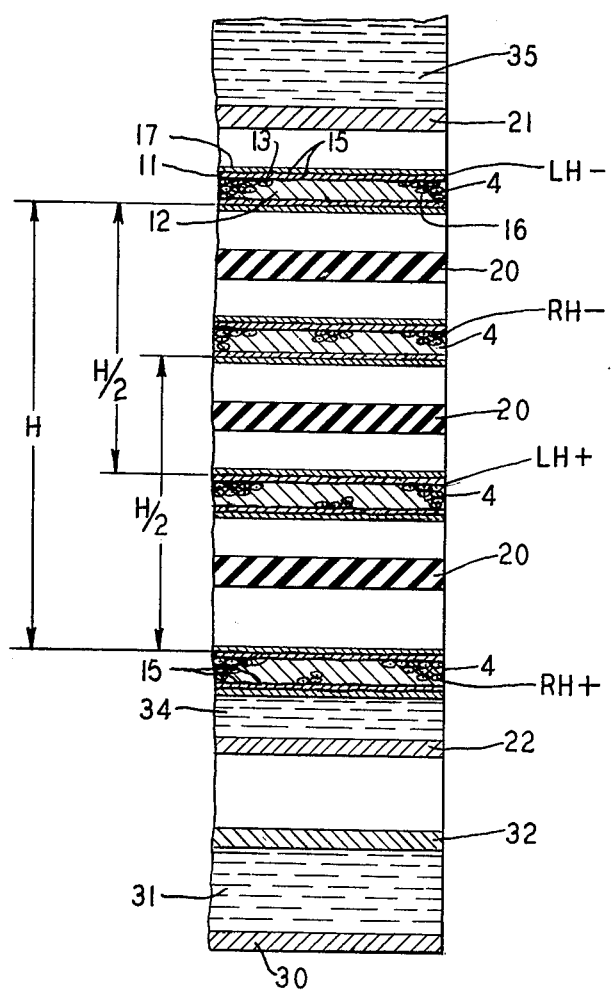

COMPOSITE MONOLITHIC LOW-LOSS SUPERCONDUCTOR FOR POWER TRANSMISSION LINE

FIELD OF THE INVENTION

The present invention has general applicability to the field of high power transmission by means of superconducting cables, but has particular utility in direct current applications.

BACKGROUND OF THE INVENTION

The phenomenon of superconductivity—i.e., zero electrical resistance, exhibited by many metals at near absolute zero temperatures—has been under investigation for many years. Likewise, studies directed at the practical utilization of superconductivity have been underway for some time. However, as yet few uses have actually been made of the phenomenon, despite its obvious utility in such areas of technology as, for example, power transmission. The economic benefit of zero resistance and the resulting loss-free power transmission is thought to be so great as to outweigh the practical problems involved; for example, that of keeping the superconductive cable cold enough so as not to revert to the normally conductive state. Therefore, many attempts have been made to fabricate a useful superconducting power line. The present invention concerns itself with the realization of this goal and provides a superconducting cable which can carry a useful amount of either alternating or direct current (hereafter ac or dc).

The criteria for a workable power transmission line are essentially that it have low or zero power loss, be readily and economically manufactured, and be electrically stable so as not to be the weakest link in the system in which it is used. Bearing these criteria in mind, it is instructive to consider the application of superconductor technology to the transmission of large quantities of electrical power.

The superconductive property in all materials is defeated by exceeding any one of three limits: the critical temperature ($T_c$), the critical current density ($J_c$), and the critical magnetic field ($H_c$), each measured at some given value of the other two. These parameters are to some degree interrelated as well; for example, the critical field decreases with an increase in current density. Thus far, the material which has the most favorable critical quantities and which is also practical to fabricate is niobium stannide ($Nb_3Sn$). While superconductors with higher critical values are known, as yet there has not been developed a commercially practicable method for their manufacture; therefore, this discussion will focus on $Nb_3Sn$.

A second group of design factors is the result of the current travel characteristics of ac and dc. While dc travels through a conductor as a whole (i.e., penetrates the bulk of the conductor), ac, of frequencies above roughly 30 Hz, travels in the outer layer of the conductor at a depth inversely proportional to the frequency—the so-called "skin effect." Hence, dc conductors are usually made in bulk shapes, but ac conductors of a given cross-sectional area are most useful in thin, sheet-like shapes. Furthermore, it is unavoidable that any dc current will have some fluctuations or impurities which behave as ac. Thus a monofilamentary dc conductor will carry the "pure" dc in its center and the ac fluctuations on its surface. A further point to be considered is that somewhere in every circuit, current must at any point in time be flowing in antiparallel directions. It is well known that ac in such circumstances will flow on the surfaces of the conductors which face each other; thus, in order to increase the total current-carrying ability of a given conductor, its design must be such that these facing surfaces are of maximum area.

In the design of superconductors, it is generally found that their performance can be greatly improved by positioning them in close proximity to a material of good electrical conductivity so that if they should for some reason "go normal" and return to the nonsuperconductive state, an alternative current path is provided, thus permitting the superconductor to once again lose all resistivity, and assume its proper function.

It is therefore the object of the invention to provide a stabilized superconductor suitable for carrying large currents of less-than-pure dc, or of ac.

It is a further object of the invention to provide a method whereby such a superconductor can be made economically and practically.

It is still another object of the invention to show how such a superconductor can be adapted for use in a low-loss power transmission cable.

Other objects and aspects of the invention will appear to those skilled in the art.

SUMMARY OF THE INVENTION

In accordance with the product of the invention, there is provided a composite superconductor of tape configuration having a multitude of filamentary superconductors intended to carry dc embedded in a nonsuperconducting matrix of rectangular cross section. Advantageously, the aspect ratio of the tape (i.e., the ratio of its width to its thickness) is high, so that the tape may be wrapped around a comparatively small diameter tube. The wider sides of the tape are covered first in at least one layer of a superconducting material, which carry ac. These layers are then covered with stabilizing metal (e.g., Cu) or strengthening material (stainless steel). In this manner a superconductor is provided, suitable for carrying large amounts of either dc or ac.

Such a tape may be readily manufactured by a combination of processes well known in the prior art. For example, a matrix of bronze in which are embedded rods or wires or niobium may be enclosed in a niobium sheath, which may then be enclosed in a bronze tube. This product may be worked to a flat tape by conventional methods and the ends of the tape (when viewed in cross section) may then be slit off, so as to prevent a continuous current path around the outside of the conductor. The conductor, if it is made up of the type of superconductor which requires heat treatment to form the superconductive material (e.g., $Nb_3Sn$, $V_3Ga$, $Nb_3Ge$) is then so treated. The superconductive material is thus formed by a process of intermetallic diffusion. The outermost layer of bronze may then be removed, for example by etching, and a layer of a stabilizing or strengthening material added. It is essential in the case of some stabilizing materials that the heat treatment be performed before the stabilizer is added; for example, if Cu is used to stabilize a $Nb_3Sn$ conductor made by the Cu-Sn bronze-niobium method described, if the Cu is added before heat treatment it will be alloyed with tin in the heat treatment, and its electrical conductivity greatly reduced.

The invention will be better understood by reference to the accompanying drawings, in which FIGS. 1-4 represent the stages of manufacture of the superconductor and show cross-sectional views of it after the stages mentioned; FIG. 5 represents a perspective view of a superconductive cable made using the conductors of the invention; FIG. 6 represents a cross-sectional view of the conductor of FIG. 5; and FIG. 7 represents an enlarged half-elevation of the central section of the conductor of FIGS. 5 and 6.

DESCRIPTION OF THE PREFERRED EMBODIMENTS

Referring now to FIG. 1, there is there depicted a composite superconductor of conventional type, having a plurality of filaments 13 of, in this embodiment, niobium, disposed in a matrix 12 of copper-tin bronze, enclosed in a tube 11 of niobium, further enclosed in a second tube 10 of bronze. A number of alternatives are possible; for example, the filaments 13 could be of niobium-titanium alloy, a material having useful superconductive properties, and the matrix material 12 could then be aluminum or copper; a niobium-titanium tube 11 would enclose the matrix 12. Yet another possibility is that the filaments 13 and matrix 12 could be replaced by a plurality of discrete superconducting rods of round or hexagonal cross section.

Referring now to FIG. 2, the round composite of FIG. 1 has been drawn to size, rolled to a high aspect ratio tape (it is envisaged that the thickness of the tape thus formed might be 1 - 20 mils and its width 5 - 100 mm) and its ends 14 slit off and discarded, all by conventional metal working processes. In FIG. 3, the composite material of FIG. 2 has been heat-treated to diffuse the tin of the bronze of the matrix 12 and the layers 10 into the niobium filaments 13 and the niobium layers 11, respectively, thus forming closed $Nb_3Sn$ layers 16 around the Nb filaments 13, which will have been to some extent flattened by the rolling process, and $Nb_3Sn$ layers 15 at the interfaces between the Nb layers 11 and the bronze matrix 12 and the bronze layers 10.

In FIG. 4, the outermost bronze layers 10 have been removed by any suitable process (e.g., by etching, or by dipping into a bath of molten solder) and have been replaced by layers of Cu or Al, applied by any suitable process (e.g., electron beam deposition, high-rate magnetron sputtering, electroplating or soldering). One is thus left with a composite superconductor having a plurality of filaments 16 suitable for carrying dc, four layers of superconductor suitable for carrying ac, and layers of stabilizing metal for carrying the current in the event of breakdown of the superconductor. Alternatively one or both of the stabilizing layers can be replaced with a mechanically strengthening material, e.g., stainless steel, Mo or W. The particular utility of the doubled layers of superconductor is to provide additional ac-carrying capability in the event of a breakdown of the outer layer, thus also providing an additional shield against any magnetic field which might degrade the superconducting properties of the dc-carrying filaments 16 within.

Referring now to FIGS. 5 and 6, there is depicted an embodiment of a power transmission cable made using the tape of the invention as shown in FIG. 4. FIG. 5 shows a perspective view of the conductor; FIG. 6, a cross section.

It will be obvious that a primary requirement for any superconductive cable will be provision for cooling the conductor(s) to cryogenic temperatures. Therefore, a cable using the conductor of the invention may be built around a central pipe 21 carrying pressurized helium 35, at up to 10K, and is enclosed in a concentric pipe 22 also carrying helium 34. This assembly is then further enclosed by pipe 32; the space 33 between pipes 22 and 32 is evacuated; the assembly is finally enclosed by pipe 30; and the space between pipes 30 and 32 is filled with liquid nitrogen 31 at 77K. Alternatively the space between pipes 30 and 32 can be a helium return line. All these pipes may typically be made of stainless steel. Supporting structure and insulating material are of course also necessary to the fabrication of the cable; being of conventional design, they are not shown.

Disposed concentrically between the inner and outer helium-carrying pipes 21 and 22 are arranged four superconductive layers each made up of several conductors 4, separated on from the next by layers of insulation 20. The various layers of conductors 4 and insulation 20 are intended to be in close physical contact; they have been drawn separated in FIG. 6 for reasons of clarity. The inner and outermost layers of conductors 4 may also be insulated from the helium pipes 21 and 22.

It will be noted that the four layers of conductors 4 have been drawn wrapped in a helicoidal fashion and labeled (reading from the inside out) RH+, LH+, RH−, and LH−. The helicoidal wrapping is designed to allow expansion of the cable and flexibility of the conductors. The labels "RH" and "LH" indicate the direction of the helicoidal wrappings and the "+" and "−" signs indicate the relative polarities of the ac carried by the conductors at any given instant of time. Thus the filaments 16 of the inner pair of conductor windings would carry the pure dc current in one direction and the outer pair carry it back, while the film conductors 15 would carry the impurities or ac, the polarities of which would vary with respect to the dc component. The polarities of the ac components carried on the "+" layers would always be opposite that carried on the "−" layers, however. Alternatively, in a three-phase ac system, the inner conductors labeled "+" would carry the current while the outer "−" layers would be a shield. In this embodiment three of the cables of FIGS. 5 and 6 would obviously be required; the peaks of the current would be phased 120° apart.

Referring now to FIG. 7, it will be shown how the use of four layers of composite conductors 4 insulated by layers 20 serves to reduce the magnetic field felt by the internal dc-carrying filaments 16.

As discussed above, ac in a circuit is carried on the surfaces of the conductors most closely approaching each other. Hence the layers of film which in this design abut on helium-carrying pipes 21 and 22 can be disregarded. If a fluctuation in current ΔJ is present at any given time (as measured between the "+" and "−" layers) a magnetic field H will be set up between the inner layers of conductive layers RH+ and LH−, as indicated in FIG. 7, which represents a half-elevation of the section of FIG. 6 between helium pipes 21 and 22.

The importance of the reversal of the direction of the helicoidal windings of the conductive layers 4 is now apparent. Since the magnetic field H exists as a function of the current difference ΔJ, it follows that it can only exist in appreciable amounts between parallel conductors—in this case, between conductors RH+ and RH− and between conductors LH+ and LH−. Therefore, the magnetic field H will essentially be split into two components, each having a magnitude H/2. These components will exist, according to the rule that ac is carried on the facing surfaces of parallel conductors, between the inner film of layer LH− and the outer film of layer LH+ and between the inner film of layer RH− and the outer film of layer RH+, as indicated in FIG. 7. FIG. 7 also illustrates that none of the dc-carrying filaments will be affected by a magnetic field of magnitude greater than H/2—thus doubling the impurities permissible in the dc carried before $H_c$ is exceeded.

It will also be apparent to those skilled in the art that conductors having only one film, if the film is properly aligned, will have the characteristics described above. However, it is easier to manufacture a conductor having films on both sides than one with only one; moreover, the superconductor is then symmetric and much simpler to install. Therefore the method of the invention is commercially feasible.

A second improvement made by the invention is the provision of dual films on both sides of the conductor. In this manner it is assured that there will at all times be sufficient current-carrying capability.

A further use of the conductor made by the method of the invention is in the art of magnet-winding, wherein a tape configuration is highly desirable for reasons of the "packing factor"—a term describing the amount of conductor cross-sectional area which can be packed into a given volume. The tape of the invention can be made into any desired aspect ratio (i.e., the ratio of width to height, viewed in cross section) and so is useful in this application. Furthermore, in many magnet applications it is desirable to have a film/filament structure, since these applications frequently involve magnetic pulses, produced by rapid variance of the dc current, equivalent to ac.

The method of the invention, and the product produced thereby, is expected to have a wide range of applicability to these and other fields. It will be further utilized through the development of modifications which can be made thereto without departing from the spirit and scope of the invention, which are defined by the following claims.

What I claim as new and desire to secure by Letters Patent of the United States is:

1. A composite superconductive tape having:
   (a) a rectangular central matrix element having a pair of wider faces and a pair of narrower faces when viewed in cross-section of a nonsuperconductive material in which are embedded a plurality of superconductive filaments;
   (b) a pair of layers of superconductive material bonded to said wider pair of faces of said matrix;
   (c) a pair of layers of a superconductive precursor material, selected such that it forms a superconductive compound when interreacted with the material of the matrix, bonded to said pair of layers of superconductive material;
   (d) a second pair of layers of superconductive material bonded to said pair of layers of superconductor precursor material; and
   (e) a pair of layers of a second nonsuperconductive material bonded to said second pair of layers of superconductive material.

2. The tape of claim 1 wherein the matrix material is a tin-bearing bronze and the superconductor precursor material is niobium.

3. The tape of claim 1 wherein the matrix material is a gallium-bearing bronze and the superconductor precursor material is vanadium.

4. The tape of claim 1 wherein said second nonsuperconducting material is selected from the group consisting of copper, aluminum, gold, silver, stainless steel, molybdenum and tungsten.

5. A composite superconductive tape having:
   (a) a rectangular base matrix having a pair of wider faces and a pair of narrower faces when viewed in cross-section comprising a plurality of superconductive filaments embedded in a matrix of a normally conductive metal;
   (b) a layer of a superconductive material bonded to one of the wider faces of said matrix;
   (c) a layer of a superconductor precursor material bonded to said layer of superconductive material;
   (d) a second layer of a superconductive material bonded to said layer of superconductor precursor material; and
   (e) a layer of a material selected from the group consisting of copper, aluminum, gold, silver, stainless steel, molybdenum and tungsten bonded to said second layer of superconductive material.

6. The tape of claim 5 wherein the superconductive filaments are layers of niobium stannide formed around cores of niobium and the matrix is a tin-bearing bronze.

7. The tape of claim 5 wherein the superconductive filaments are layers of vanadium gallide ($V_3Ga$) formed around cores of vanadium and the matrix is a gallium-bearing bronze.

8. The tape of claim 5 wherein the superconducting filaments are made of the alloys of niobium and titanium and the matrix material is selected from the group consisting of copper, aluminum, silver and gold.

9. The tape of claim 5 wherein the layers of superconductive material are of the alloys of niobium and titanium.

10. The tape of claim 5 wherein the superconducting filaments are of niobium.

11. A composite superconductive tape having:
    (a) a rectangular matrix having a pair of wider faces and a pair of narrower faces when viewed in cross-section comprising a plurality of superconductive filaments embedded in a matrix of normally conductive material; and
    (b) at least one layer of superconductive material bonded to each of the wider pair of faces of said rectangular matrix.

12. The tape of claim 11 wherein the outermost layers have layers of a material selected from the group consisting of gold, silver, copper, aluminum, stainless steel, molybdenum, and tungsten bonded to their faces opposite to their faces which are in contact with the matrix material.

13. The tape of claim 11 wherein the superconductive filaments are layers formed around filaments of a material which when interreacted with the material of the matrix forms a superconducting compound.

14. The tape of claim 11 wherein the superconductive filaments are formed from the alloys of niobium and titanium and the matrix is of a material chosen from the group consisting of aluminum, copper, silver, gold, stainless steel, molybdenum and tungsten.

* * * * *